United States Patent
Wu et al.

(10) Patent No.: US 7,105,850 B2
(45) Date of Patent: Sep. 12, 2006

(54) GAN LED STRUCTURE WITH P-TYPE CONTACTING LAYER GROWN AT LOW-TEMPERATURE AND HAVING LOW RESISTIVITY

(75) Inventors: Liang-Wen Wu, Banciao (TW); Ru-Chin Tu, Tainan (TW); Cheng-Tsang Yu, Wufong Township, Taichung County (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 11/050,091

(22) Filed: Feb. 3, 2005

(65) Prior Publication Data

US 2006/0027821 A1    Feb. 9, 2006

(30) Foreign Application Priority Data

Aug. 4, 2004  (TW) .............................. 93123354 A

(51) Int. Cl.
*H01L 33/00* (2006.01)
*H01L 29/20* (2006.01)
(52) U.S. Cl. ............................ 257/13; 257/79; 257/94; 257/102; 257/103; 257/E33.025; 257/E33.026; 257/E33.028; 257/E33.029
(58) Field of Classification Search .................. 257/13, 257/79, 94, 102, 103, E33.026, E33.025
See application file for complete search history.

(56) References Cited

U.S. PATENT DOCUMENTS

| | | | | |
|---|---|---|---|---|
| 5,877,558 A | * | 3/1999 | Nakamura et al. | 257/749 |
| 6,815,726 B1 | * | 11/2004 | Ishida et al. | 257/94 |
| 6,900,465 B1 | * | 5/2005 | Nakamura et al. | 257/79 |
| 2004/0211967 A1 | * | 10/2004 | Hirayama et al. | 257/79 |

OTHER PUBLICATIONS

Hetano et al. "New magnesium doping source for metalorganic chemical vapor deposition: Octamethyldialuminum-monomagnesium" Appl. Phys. Lett. 58 (14), Apr. 8, 1991.*

* cited by examiner

*Primary Examiner*—N. Drew Richards
*Assistant Examiner*—Sean Fletcher

(57) ABSTRACT

Disclosed is a GaN LED structure with a p-type contacting layer using Al—Mg-codoped $In_{1-y}Ga_yN$ grown at low temperature, and having low resistivity. The LED structure comprises, from the bottom to top, a substrate, a buffer layer, an n-type GaN layer, an active layer, a p-type shielding layer, and a p-type contacting layer. In this invention, Mg and Al are used to co-dope the $In_{1-y}Ga_yN$ to grow a low resistive p-type contacting layer at low temperature. Because of the Al—Mg-codoped, the light absorption problem of the p-type $In_{1-y}Ga_yN$ layer is improved. The product, not only has the advantage of convenience of the p-type contacting layer for being manufactured at low temperature, but also shows good electrical characteristics and lowers the operating voltage of the entire element so that the energy consumption during operation is reduced and the yield rate is increased.

12 Claims, 4 Drawing Sheets

GAN LED STRUCTURE WITH P-TYPE CONTACTING LAYER GROWN AT LOW-TEMPERATURE AND HAVING LOW RESISTIVITY

FIELD OF THE INVENTION

The present invention generally relates to a structure for InGaN/GaN multiquantum well (MQW) light emitting diodes (LED), and more specifically to an LED structure with a p-type contacting layer made with Al—Mg-codoped $In_{1-y}Ga_yN$ grown at low temperature and having low resistivity.

BACKGROUND OF THE INVENTION

Conventional multiquantum well (MQW) $In_{1-y}Ga_yN$/GaN light emitting diodes (LED) use a p-type GaN grown at high temperature as a contacting layer. The contacting layer is usually grown on top of the active (light-emitting) layer. During the manufacturing, it is found that the contacting layer grown at high temperature will affect the epitaxial characteristics of the active layer grown at low temperature in the previous step, so that the epitaxy will not keep the regular structure formed during its growth. The result of this effect is that the LED is either dysfunctional, or has poor electrical characteristics, such as having higher operating voltage so that the energy consumption is increased. Therefore, it is imperative to provide a new structure so that a p-type contacting layer grown at low temperature and having low resistivity can be obtained.

SUMMARY OF THE INVENTION

The present invention has been made to overcome the above-mentioned drawback of conventional GaN MQW LED structures that need a high temperature to grow a p-type contacting layer. The primary object of the present invention is to provide a GaN MQW LED structure with a low resistive p-type contacting layer that is made of $In_{1-y}Ga_yN$ codoped with Mg and Al, and can be grown at low temperature. The resistivity of the p-type contact layer of the present invention is lower than that of the conventional p-type contacting layer is because the Al-doped p-type contacting layer has more two-dimensional hole carriers and their mobility. Also, the $In_{1-y}Ga_yN$ has a lower energy gap than the GaN, so that the lower resistivity can be achieved. Otherwise, if an ITO (Indium Tin Oxide) transplant contacting layer is used instead of a metal conductive layer, which is made of Ni/Au and so on to be a p-type electrode layer, the $In_{1-y}Ga_yN$ on the top surface co-doped with Mg and Al will have better reliability, because Al can block In and Sn inter-diffusion.

The second object of the present invention is to improve the light absorption problem caused by the material of the p-type contacting layer. In general, the p-type contacting layer is on top of the active layer; therefore, the p-type contacting layer will absorb the light and lower the external quantum efficiency of the GaN MQW LED. Because the p-type contacting layer made of Al—Mg-codoped $In_{1-y}Ga_yN$ can be grown at a low temperature in the present invention, the lateral growth rate of the GaN material is reduced so that the coarsened surface can be achieved, which, in turn, reduces the possibility of light being reflected and increases the external quantum efficiency.

The third object of the present invention is to provide a convenient step of growing a p-type contacting layer at a low temperature after manufacturing the active layer, to improve the overall electrical characteristics so as to have a lower operating voltage and lower energy consumption, and to increase the yield rate. Compared to the conventional p-type contacting layer, the growth temperature of the p-type contacting layer of the present invention is lower. Therefore, the $In_{1-y}Ga_yN$ active layer and the $In_{1-y}Ga_yN$ grown p-type contacting layer can both be grown at the same low temperature in order to protect the $In_{1-y}Ga_yN$ active layer and increase the external quantum efficiency of the element.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
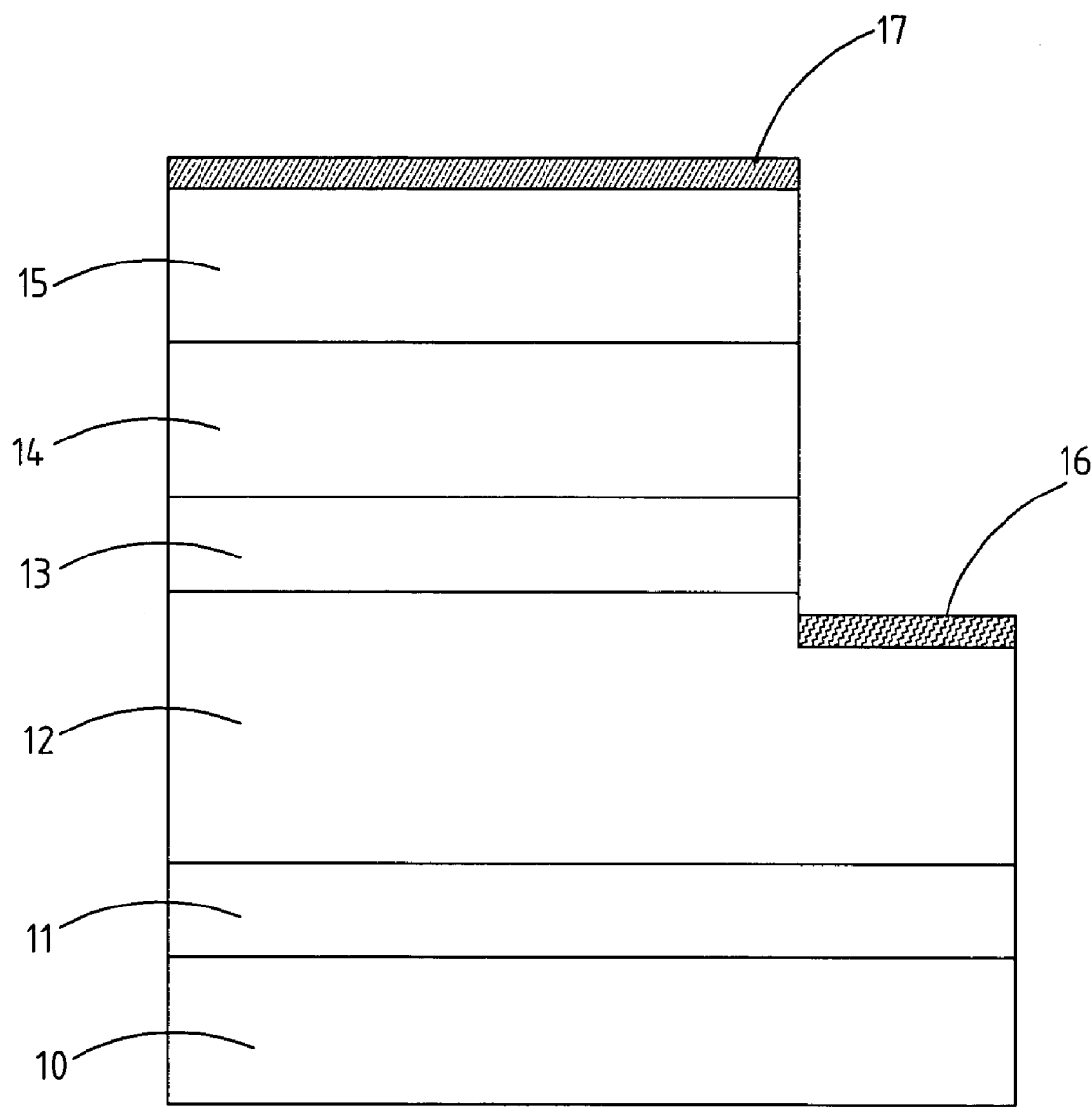
FIG. 1 shows a first embodiment of the present invention of a GaN LED structure having a p-type contacting layer.

FIG. 1 shows a first embodiment of the present invention of a GaN LED structure having a p-type contacting layer grown at low temperature and having low resistivity. The embodiment includes a substrate 10, a buffer layer 11, an n-type GaN layer 12, an active layer 13, a p-type shielding layer 14, and a p-type contacting layer 15. Substrate 10 can be made of sapphire (including C-Plane, R-Plane and A-Plane), SiC (6H-SiC or 4H—SiC), Si, ZnO, GaAs, and $MgAl_2O_4$. It can also be made of a single crystal oxide having a lattice constant close to that of an N-compound semiconductor. But, in general, it is made of sapphire and SiC. Buffer layer 11 is located on top of substrate 10, and is made of $Al_{1-x-y}Ga_xIn_yN$, where $0 \leq x < 1$, $0 \leq y < 1$ and $x+y \leq 1$.

Located on top of buffer layer 11 is n-type GaN layer 12. Active layer 13, which is located on top of n-type GaN layer 12, is made of $Al_{1-x-y}Ga_xIn_yN$. Located on top of the active layer 13 is a p-type shielding layer 14, which is made of Mg-doped p-type $Al_{1-x}In_xN$, where $0<X<1$, but preferably $0.1 \leq X \leq 0.4$. The thickness of p-type shielding layer 14 is between 50Å and 3000Å, and it is grown at temperature between 600° C. and 1100° C. Located on top of p-type shielding layer 14 is p-type contacting layer 15, which is made of Al—Mg-codoped p-type $In_yGa_{1-y}N$, where $0 \leq Y \leq 1$. The thickness of p-type contacting layer 15 is between 200Å and 3000Å, and it is grown at temperature between 600° C. and 1100° C.

According to the first embodiment, the present invention can further include an n-type electrode layer 16 on top of n-type GaN layer 12. In addition, according to the first embodiment, the present invention can further include a p-type electrode layer 17 on top of p-type contacting layer 15. The p-type electrode layer 17 further includes a metal conductive layer, which is made of Ni/Au, Ni/Pt, Ni/Pd, Ni/Co, Pd/Au, Pt/Au, Ti/Au, Cr/Au, Sn/Au, Ta/Au, TiN, TiWNx, WSix, or a transparent conductive oxide layer (TCO), which is made of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$.

Figure 2:
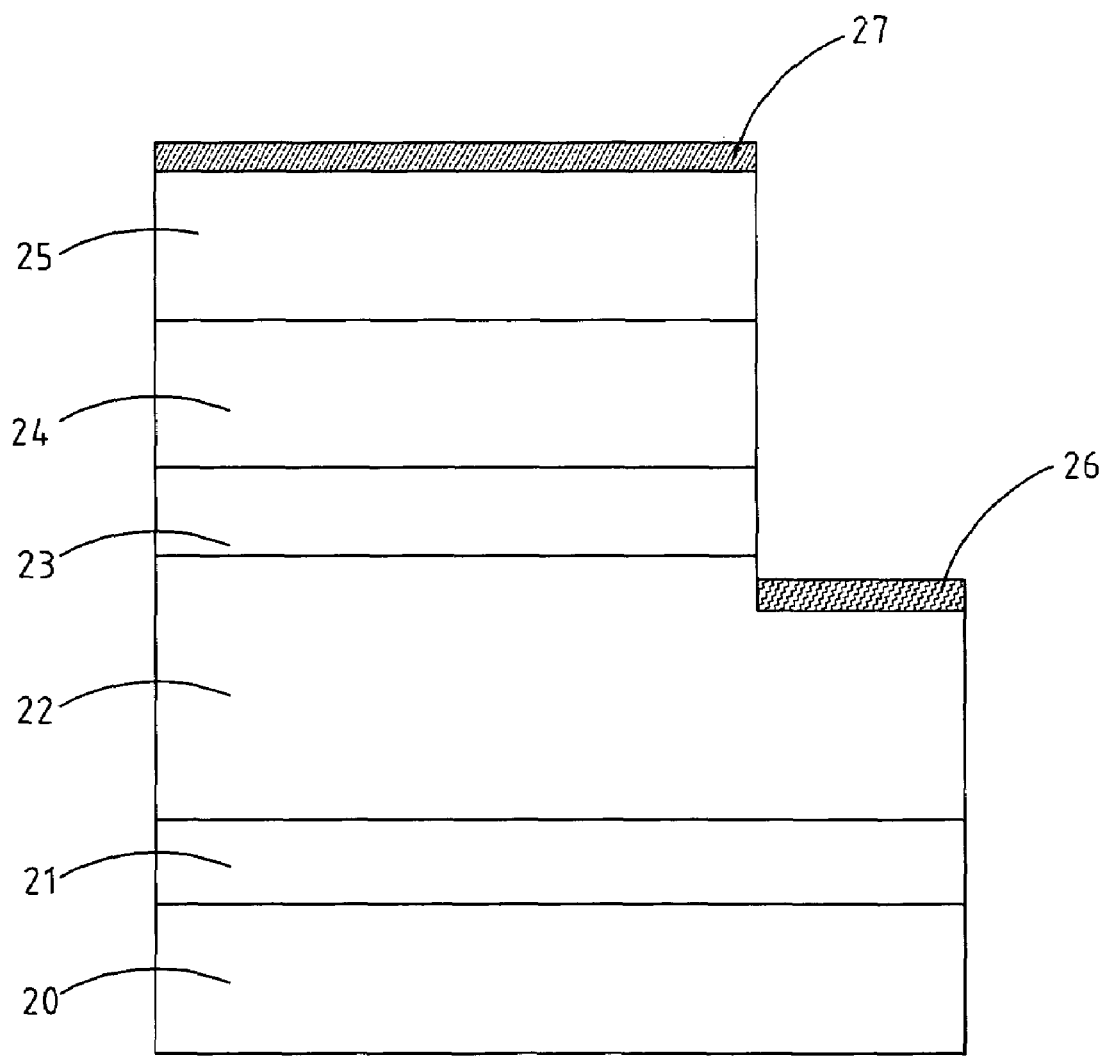
FIG. 2 shows a second embodiment of the present invention of a GaN LED structure having a p-type contacting layer.

FIG. 2 shows a second embodiment of the present invention of a GaN LED structure having a p-type contacting layer grown at low temperature and having low resistivity. The embodiment includes a substrate 20, a buffer layer 21, an n-type GaN layer 22, an active layer 23, a p-type shielding layer 24, and a p-type contacting layer 25. Substrate 20 can be made of sapphire (including C-Plane, R-Plane and A-Plane), SiC (6H—SiC or 4H—SiC), Si, ZnO, GaAs, and $MgAl_2O_4$. It can also be made of a single crystal oxide having a lattice constant close to that of an N-compound semiconductor. But, in general, it is made of sapphire and SiC. Buffer layer 21 is located on top of substrate 20, and is made of $Al_{1-x-y}Ga_xIn_yN$, where $0 \leq X < 1$, $0 \leq Y < 1$, and $X+Y \leq 1$.

Located on top of buffer layer 21 is n-type GaN layer 22. Active layer 23, which is located on top of n-type GaN layer 22, is made of $Al_{1-x-y}Ga_xIn_yN$. Located on top of active layer 23 is p-type shielding layer 24, which is made of Mg—Ga-codoped p-type $Al_{1-x}In_xN$, where $0 \leq X < 1$, but preferably $0.1 \leq X \leq 0.4$. The thickness of p-type shielding layer 24 is between 50Å and 3000Å, and it is grown at temperature between 600° C. and 1100° C. Located on top of p-type shielding layer 24 is p-type contacting layer 25, which is made of Al—Mg-codoped p-type $In_yGa_{1-y}N$, where $0 \leq Y < 1$. The thickness of p-type contacting layer 25 is between 200Å and 3000Å, and it is grown at temperature between 600° C. and 1100° C.

According to the second embodiment, the present invention can further include an n-type electrode layer 26 on top of n-type GaN layer 22. In addition, according to the second embodiment, the present invention can further include a p-type electrode layer 27 on top of p-type contacting layer 25. The p-type electrode layer 27 further includes a metal conductive layer, which is made of Ni/Au, Ni/Pt, Ni/Pd, Ni/Co, Pd/Au, Pt/Au, Ti/Au, Cr/Au, Sn/Au, Ta/Au, TiN, TiWNx, WSix, or a transparent conductive oxide layer (TCO), which is made of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$.

Figure 3:
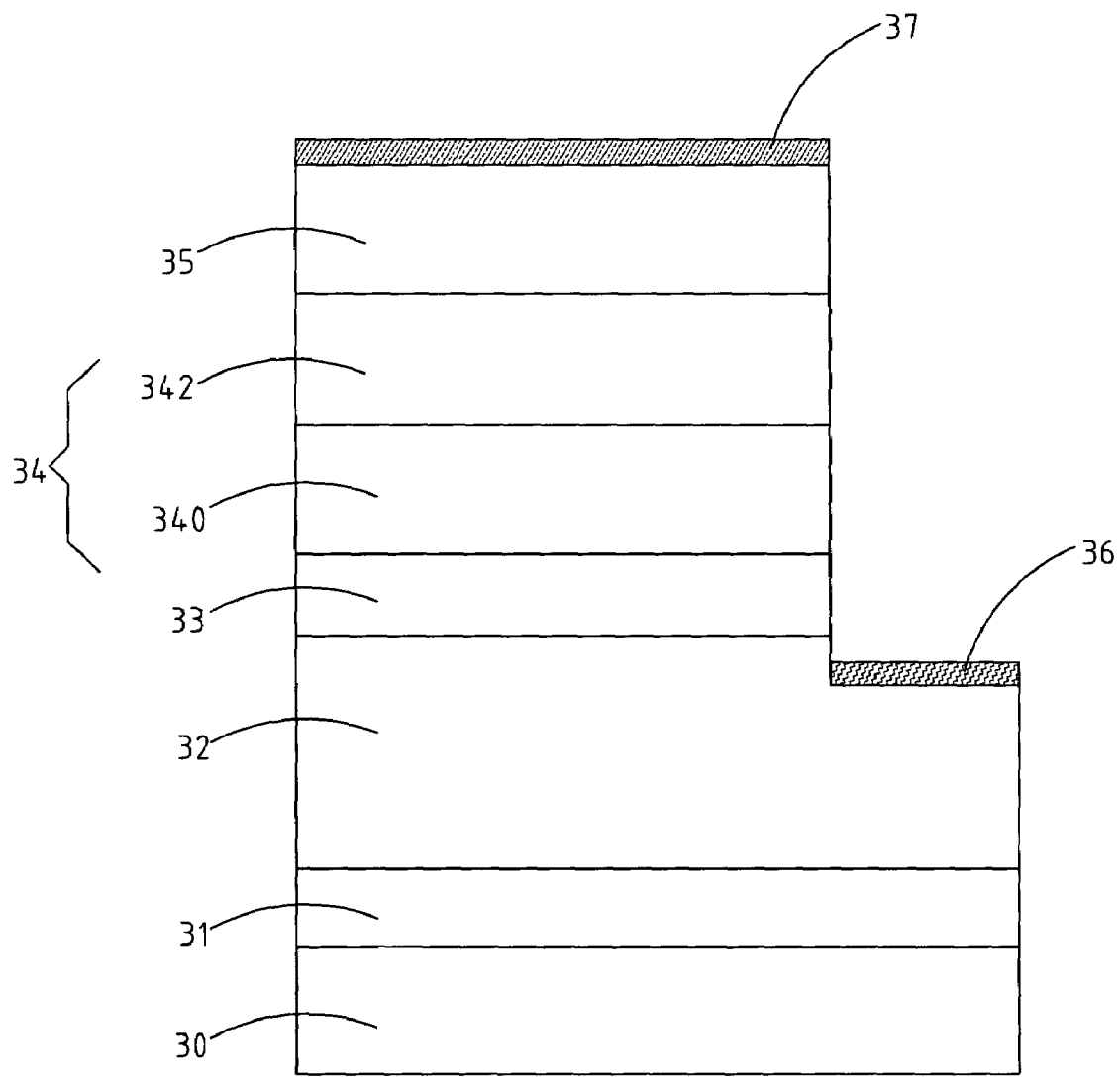
FIG. 3 shows a third embodiment of the present invention of a GaN LED structure having a p-type contacting layer.

FIG. 3 shows a third embodiment of the present invention of a GaN LED structure having a p-type contacting layer grown at low temperature and having low resistivity. The embodiment includes a substrate 30, a buffer layer 31, an n-type GaN layer 32, an active layer 33, a double shielding layer 34, and a p-type contacting layer 35. Substrate 30 can be made of sapphire (including C-Plane, R-Plane and A-Plane), SiC (6H—SiC or 4H—SiC), Si, ZnO, GaAs, and $MgAl_2O_4$. It can also be made of a single crystal oxide having a lattice constant close to that of an N-compound semiconductor. But, in general, it is made of sapphire and SiC. Buffer layer 31 is located on top of substrate 30, and is made of $Al_{1-x-y}Ga_xIn_yN$, where $0 \leq X < 1$, $0 \leq Y < 1$, and $X+Y=1$.

Located on top of buffer layer 31 is n-type GaN layer 32. Active layer 33, which is located on top of n-type GaN layer 32, is made of $Al_{1-x-y}Ga_xIn_yN$. Located on top of active layer 33 is double shielding layer 34, which further includes a first shielding layer 340, and a second shielding layer 342. First shielding layer 340, which is located on top of active layer 33, is made of Mg—Ga-codoped p-type $Al_{1-x}In_xN$, where $0<X<1$, but preferably $0.1 \leq X \leq 0.4$. The thickness of first shielding layer 340 is between 50Å and 3000Å, preferably between 50Å and 1000Å, and it is grown at temperature between 600° C. and 1100° C. Second shielding layer 342, which is located on top of first shielding layer 340, is made of Mg-doped p-type $Al_{1-z}In_zN$, where $0<Z<1$, but preferably $0.1 \leq Z \leq 0.4$. The thickness of second shielding layer 342 is between 50Å and 3000Å, preferably between 50Å and 1000Å, and it is grown at temperature between 600° C. and 1100° C. Located on top of double shielding layer 34 is p-type contacting layer 35, which is made of Al—Mg-codoped p-type $In_yGa_{1-y}N$, where $0 \leq Y < 1$. The thickness of p-type contacting layer 35 is between 200Å and 3000Å, and it is grown at temperature between 600° C. and 1100° C.

According to the third embodiment, the present invention can further include an n-type electrode layer 36 on top of n-type GaN layer 32. In addition, according to the third embodiment, the present invention can further include a p-type electrode layer 37 on top of p-type contacting layer 35. The p-type electrode layer 37 further includes a metal conductive layer, which is made of Ni/Au, Ni/Pt, Ni/Pd, Ni/Co, Pd/Au, Pt/Au, Ti/Au, Cr/Au, Sn/Au, Ta/Au, TiN, TiWNx, WSix, or a transparent conductive oxide layer (TCO), which is made of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$.

Figure 4:
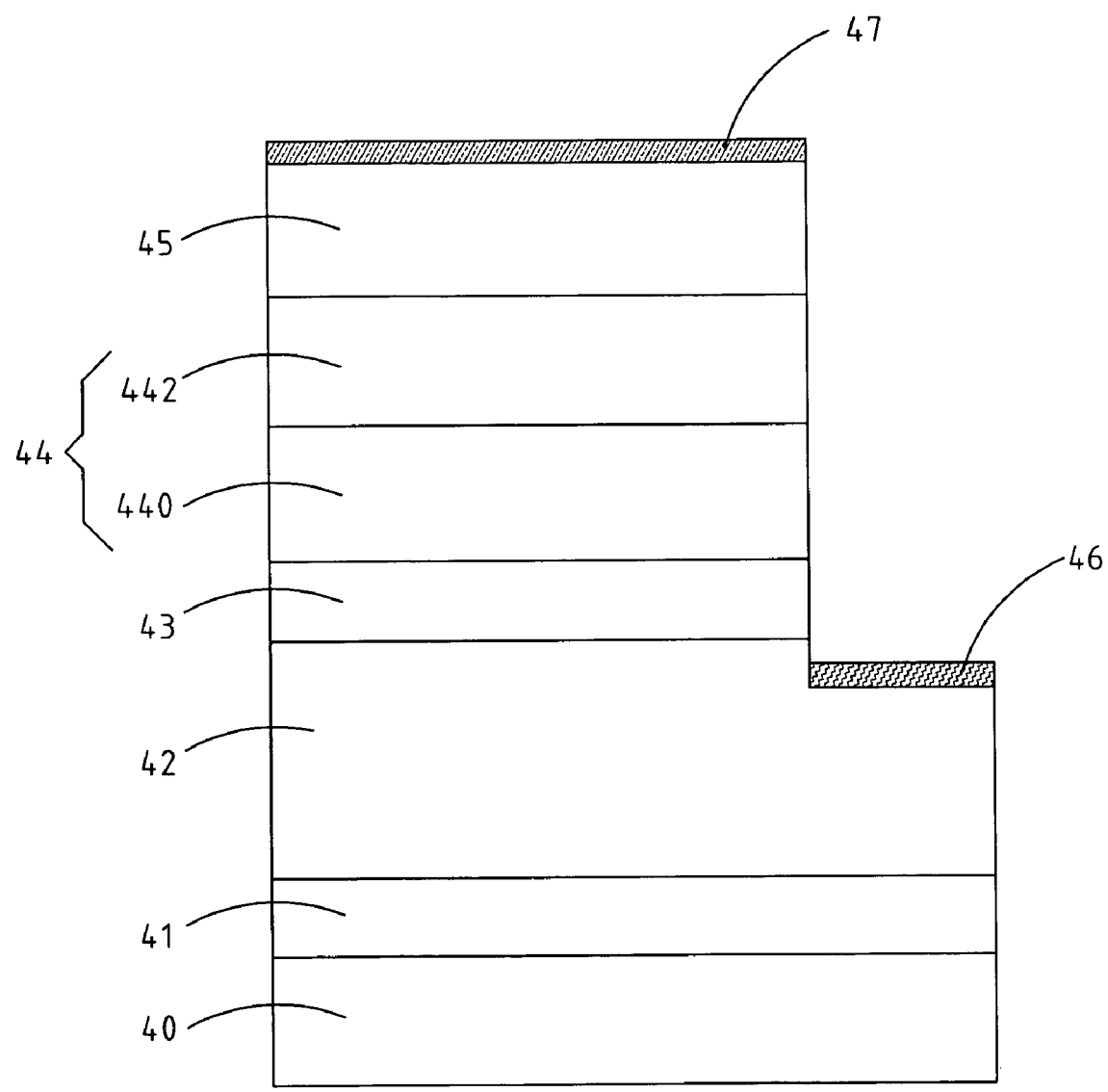
FIG. 4 shows a fourth embodiment of the present invention of a GaN LED structure having a p-type contacting layer.

FIG. 4 shows a fourth embodiment of the present invention of a GaN LED structure having a p-type contacting layer grown at low temperature and having low resistivity. The embodiment includes a substrate 40, a buffer layer 41, an n-type GaN layer 42, an active layer 33, a double shielding layer 44, and a p-type contacting layer 45. Substrate 40 can be made of sapphire (including C-Plane, R-Plane and A-Plane), SiC (6H—SiC or 4H—SiC), Si, ZnO, GaAs, and $MgAl_2O_4$. It can also be made of a single crystal oxide having an lattice constant close to that of an N-compound semiconductor. But, in general, it is made of sapphire and SiC. Buffer layer 41 is located on top of substrate 40, and is made of $Al_{1-x-y}Ga_xIn_yN$, where $0 \leq X < 1$, $0 \leq Y < 1$, and $X+Y \leq 1$.

Located on top of buffer layer 41 is n-type GaN layer 42. Active layer 43, which is located on top of n-type GaN layer 42, is made of $Al_{1-x-y}Ga_xIn_yN$. Located on top of active layer 43 is double shielding layer 44, which further includes a first shielding layer 440, and a second shielding layer 442. First shielding layer 440, which is located on top of active layer 43, is made of Mg-doped p-type $Al_{1-x}In_xN$, where $0<X<1$, but preferably $0.1 \leq X \leq 0.4$. The thickness of first shielding layer 440 is between 50Å and 3000Å, preferably between 50Å and 1000Å, and it is grown at temperature between 600° C. and 1100° C. Second shielding layer 442, which is located on top of first shielding layer 440, is made of Mg—Ga-codoped p-type $Al_{1-z}In_zN$, where $0<Z<1$, preferably $0.1 \leq Z \leq 0.4$. The thickness of second shielding layer 442 is between 50Å and 3000Å, but preferably between 50Å and 1000Å, and it is grown at temperature between 600° C. and 1100° C. Located on top of double shielding layer 44 is p-type contacting layer 45, which is made of Al—Mg-codoped p-type $In_yGa_{1-y}N$, where $0 \leq Y < 1$. The thickness of p-type contacting layer 45 is between 200Å and 3000Å, and it is grown at temperature between 600° C. and 1100° C.

According to the fourth embodiment, the present invention can further include an n-type electrode layer 46 on top of n-type GaN layer 42. In addition, according to the fourth embodiment, the present invention can further include a p-type electrode layer 47 on top of p-type contacting layer 45. The p-type electrode layer 47 further includes a metal conductive layer, which is made of Ni/Au, Ni/Pt, Ni/Pd, Ni/Co, Pd/Au, Pt/Au, Ti/Au, Cr/Au, Sn/Au, Ta/Au, TiN, TiWNx, WSix, or a transparent conductive oxide layer (TCO), which is made of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, $SrCu_2O_2$.

In summary, the GaN LED structure of the present invention comprises a p-type $In_yGa_{1-y}N$ contacting layer which is Al—Mg-codoped. As is well known in the semiconductor process, the goal of doping or co-doping is to introduce dopants (impurities) in the material. The Al—Mg-codoped $In_yGa_{1-y}N$ contacting layer contains both Al and Mg dopants (or impurities) in the $In_yGa_{1-y}N$ material. The Al and Mg dopants result in lower band-gap for the Al—Mg-codoped $In_yGa_{1-y}N$ in comparison to Al-doped contact layer commonly used in the prior arts. The low band-gap is good for the reverse electrical property of the LED structure because it avoids higher forward voltage.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN LED structure comprising:
   a substrate having a material selected from the group of sapphire, SiC, Si, ZnO, GaAs, $MgAl_2O_4$ and a single-crystal oxide with a lattice constant close to an N-Compound semiconductor;
   an $Al_{1-x-y}Ga_xIn_yN$ buffer layer with $0 \leq X < 1$, $0 \leq Y < 1$ and $X+Y \leq 1$ on top of said substrate;
   an n-type GaN layer on top of said $Al_{1-x-y}Ga_xIn_yN$ buffer layer;
   an InGaN active layer on top of said n-type GaN layer;
   a p-type shielding layer having p-type $Al_{1-x}In_xN$ with $0 < X < 1$ and a thickness between 50Å and 3000Å on top of said active layer; and
   a p-type contacting layer having Al—Mg-codoped $In_yGa_{1-y}N$ with $0 \leq Y < 1$ and a thickness between 200Å and 3000Å on top of said p-type shielding layer.

2. The LED structure as claimed in claim 1, further comprising an n-type electrode layer located on top of said n-type GaN layer.

3. The LED structure as claimed in claim 1, further comprising a p-type electrode layer located on top of said p-type contacting layer.

4. The LED structure as claimed in claim 3, wherein said p-type electrode layer includes a metal conductive layer having a material selected from the group of Ni/Au, Ni/Pt, Ni/Pd, Ni/Co, Pd/Au, Pt/Au, Ti/Au, Cr/Au, Sn/Au, Ta/Au, TiN, TiWNx, and WSix, or a transparent conductive oxide layer (TCO) having a material selected from the group of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

5. The LED structure as claimed in claim 1, wherein said p-type shielding layer is an Mg-doped p-type $Al_{1-x}In_xN$ layer.

6. The LED structure as claimed in claim 1, wherein said p-type shielding layer is an Mg—Ga-codoped p-type $Al_{1-x}In_xN$ layer.

7. A GaN LED structure comprising:
   a substrate having a material selected from the group of sapphire, SiC, Si, ZnO, GaAs, $MgAl_2O_4$ and a single-crystal oxide with a lattice constant close to an N-Compound semiconductor;
   an $Al_{1-x-y}Ga_xIn_yN$ buffer layer with $0 \leq X < 1$, $0 \leq Y < 1$ and $X+Y \leq 1$ on top of said substrate;
   an n-type GaN layer on top of said $Al_{1-x-y}Ga_xIn_yN$ buffer layer;
   an InGaN active layer on top of said n-type GaN layer;
   a p-type double shielding layer on top of said active layer, said p-type double shielding layer including a first shielding layer having p-type $Al_{1-x}In_xN$ with $0 < X < 1$ and a thickness between 50Å and 3000Å, and a second shielding layer having p-type $Al_{1-z}In_zN$ with $0 \leq Z \leq 1$ and a thickness between 50Å and 3000Å; and
   a p-type contacting layer having Al—Mg-codoped $In_yGa_{1-y}N$ with $0 \leq Y < 1$ and a thickness between 200Å and 3000Å on top of said p-type double shielding layer.

8. The LED structure as claimed in claim 7, further comprising an n-type electrode layer located on top of said n-type GaN layer.

9. The LED structure as claimed in claim 7, further comprising a p-type electrode layer located on top of said p-type contacting layer.

10. The LED structure as claimed in claim 9, wherein said p-type electrode layer includes a metal conductive layer having a material selected from the group of Ni/Au, Ni/Pt, Ni/Pd, Ni/Co, Pd/Au, Pt/Au, Ti/Au, Cr/Au, Sn/Au, Ta/Au, TiN, TiWNx, and WSix, or a transparent conductive oxide layer (TCO) having a material selected from the group of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

11. The LED structure as claimed in claim 7, wherein said first shielding layer is an Mg—Ga-codoped p-type $Al_{1-x}In_xN$ layer, and said second shielding layer is an Mg-doped p-type $Al_{1-z}In_zN$ layer.

12. The LED structure as claimed in claim 7, wherein said first shielding layer is an Mg-doped p-type $Al_{1-z}In_xN$ layer, and said second shielding layer is an Mg—Ga-codoped p-type $Al_{1-z}In_zN$ layer.

* * * * *